(12) United States Patent  (10) Patent No.: US 6,529,061 B1
Orita                     (45) Date of Patent:    Mar. 4, 2003

(54) SEMICONDUCTOR DEVICE

(75) Inventor: Shoichi Orita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/118,251

(22) Filed: Apr. 9, 2002

(30) Foreign Application Priority Data

Oct. 30, 2001 (JP) ......................................... 2001-332583

(51) Int. Cl.[7] .............................................. H03K 17/16
(52) U.S. Cl. ...................... 327/381; 327/311; 327/112; 327/427
(58) Field of Search ................... 327/379, 380, 327/381, 108, 109, 111, 112, 427, 434, 424, 333, 311, 313; 326/82, 83, 86, 87

(56) References Cited

U.S. PATENT DOCUMENTS 5,041,741 A  *  8/1991  Steele ........................... 326/83
5,397,878 A  *  3/1995  Chen ............................ 327/427
5,514,981 A  *  5/1996  Tam et al. ..................... 326/80
5,917,359 A  *  6/1999  Fukunaga et al. ........... 327/381
6,326,831 B1    12/2001  Kumagai ...................... 327/333

FOREIGN PATENT DOCUMENTS

JP   2000-252809   9/2000
JP   2001-145370   5/2001

* cited by examiner

Primary Examiner—Toan Tran
(74) Attorney, Agent, or Firm—Oblon, Spivak, McClelland, Maier & Neustadt, P.C.

(57) ABSTRACT

In a level-shift circuit of the high-side section of an HVIC, a switching-on level-shift resistance member includes two resistors, and a switching-off level-shift resistance member includes two resistors. A logic filter set fetches potentials of the both end of the resistor as signals Aon and Bon, and fetches potentials of the both end of the resistor as signals Aoff and Boff. When an output period of the signals Bon and Boff is longer than that of the signals Aon and Aoff, the logic filter set does not output an abnormal signal by judging that a recoverry signal is detected.

12 Claims, 8 Drawing Sheets

SEMICONDUCTOR DEVICE

BACKGROUND OF THE INVENTION

1. Field of the Invention

The present invention relates to a semiconductor circuit, particularly to a semiconductor device excluding a malfunction due to negative noises.

2. Description of the Related Art

FIG. 12 shows a power-device-driving circuit (boost strap type) using a conventional HVIC and a circuit in the range from the level-shift section up to the high-side output in the HVIC. When driving a power semiconductors (such as MOSFET and IGBT) 100 and 101 half-bridge connected by a high-withstand-voltage integrated circuit (HVIC), most loads of the power semiconductor are inductive (L) loads such as a motor and a fluorescent lamp. Moreover, the middle point of half-bridge connection, that is, the high-side reference potential (VS) of an HVIC transitionally fluctuates toward the negative side to a GND (substrate potential of HVIC: lowest potential) under switching (particularly, when low-side output (driving lower arm) is turned on) because of also being influenced by a parasitic L component or the like due to a wiring or the like on a printed circuit board. Furthermore, in the case of an L load, because a two- or three-phase circuit is connected through the load in FIG. 12, the reference potential (VS) vibrates to the negative side only under switching of other phase.

When the reference voltage (VS) vibrates to the negative side and recoveries, the recovery current shown in FIG. 13 circulates through a level-shift resistor R from a VB terminal as the drain current of a level-shift high-withstand-voltage MOSFET (hereafter referred to as HVMOS). Therefore, the recovery current is erroneously recognized as a high-side input signal, thereby a high-side circuit malfunctions, an abnormal signal is output to the output (HO: upper-arm control signal) of the circuit, and a trouble such as a short circuit of arm) may occur. Level shift denotes level conversion required to drive a high-rated-voltage output device at several volts (control signal level of personal computer).

This malfunction may be caused by dv/dt to be applied to a high-side reference potential (VS). That is, when external dv/dt is applied to a parasitic capacity (Cp) present between the drain and the source of an HVMOS serving as a switching device for level-shifting a low-potential reference signal (GND of HVIC: substrate voltage) in an HVIC to a high-side reference potential (V) signal, a current of Ip=Cp× dv/dt circulates through the parasitic capacity. Thereby, the above current circulates through a level-shift resistor connected to a high-side power source (VB) and a voltage drop due to the current is input to the input device of a high-side level-shift signal. Resultantly, a high-side circuit outputs an abnormal signal.

For the above trouble, the following systems are proposed: a system for selecting a level-shift signal by a CR filter and a logic filter system (Japanese Unexamined Patent Publication No. 145370/2001) excluding simultaneous input of erroneous signals to a "RS flip-flop circuit" built in a high-side circuit by a logic circuit as shown in FIG. 14.

SUMMARY OF THE INVENTION

A semiconductor device for driving a power semiconductor according to one embodiment of the present invention includes, at its high-side section, a level-shift circuit, a voltage detector (NOT), a logic filter set (7), and a drive part (9). The level-shift circuit includes a resistance member (3,4,5,6) and a switching device (1,2). The resistance member includes a switching-on level-shift resistor which is divided into two first resistors (3,4) and a switching-off level shift resistor which is divided into two second resistors (5,6). The voltage detector (NOT) detects potentials of the both end of one(3) of the first resistors as signals Aon and Bon, and detects potentials of the both end of one(5) of the second resistors as signals Aoff and Boff. The logic filter set (7) logically excludes an error signals due to dv/dt from the signals detected by the voltage detector (NOT). The drive part (9) drives the power semiconductor based on the output of the logic filter set (7). When an output period of the signals Bon and Boff is longer than that of the signals Aon and Aoff, the logic filter set (7) does not outputs an abnomal signal.

A semiconductor device for driving a power semiconductor according to another embodiment of the present invention includes, at its high-side section, a level-shift circuit, voltage detectors (NOT1,NOT2,NOT3,NOT4), a logic filter set (7), and a drive part (9). The level-shift circuit includes a switching-on level shift resistor (10), a switching-off level-shift resistor (11) and a switching device (1,2). The voltage detectors (NOT1) and (NOT2) detect potentials of the end of the resistor (10) as signals Aon and Bon, and the voltage detectors (NOT3) and (NOT4) detect potentials of the end of the resistor (10) as signals Aoff and Boff . The logic filter set (7) logically excludes an error signals due to dv/dt from the signals detected by the voltage detector (NOT). The drive part (9) drives the power semiconductor based on the output of the logic filter set (7). Said voltage detor (NOT2) and (NOT4) have a threasould higher than those of the voltage detector (NOT1) and (NOT3). When an output period of the signals Bon and Boff is longer than that of the signals Aon and Aoff, the logic filter set (7) does not outputs an abnomal signal.

DETAILED DESCRIPTION OF THE PREFERRED EMBODIMENTS

A mechanism causing said former malfunction is more-minutely described below. The "malfunction caused when the level of negative noises of VS is high" transitionally greatly fluctuates toward the negative side to the GND of an HVIC due to noises, the load under lower-arm switching (at the time of on), or a parasitic L component on a printed circuit board. In this case, if the VB potential fluctuates toward the negative side to the GND potential of the HVIC, a parasitic diode D1 present between a high-potential island and the GND in the HVIC and a parasitic diode D2 present between the source and the drain of an HVMOS are turned on and a large current flows from the substrate of the HVIC to the VB. Thereafter, a recovery current when the above parasitic diode D1 is turned off flows when the potential between the VS and the VB vibrated toward the negative side recovers. In this case, the recovery current also circulates through the parasitic diode D2 between the source and the drain of the HVMOS.

In this case, because the level shift of the HVIC signal-transfers in accordance with an edge signal (on pulse or off pulse) of a high-side output, the total of two HVMOSs such as an on-pulse-transfer HVMOS and an off-pulse-transfer HVMOS are built in and a recovery current circulates through the parasitic diodes of the two HVMOSs at the time of the above recovery because the recovery current circulating through the two HVMOSs flow through a level-shift resistor R from the VB, the VB potential lowers. When the lowered VB potential reaches the threshold of NOT at the next stage, the VB potential is detected as a level-shift signal to change high-side outputs.

In this case, because the recovery current circulates through the on-pulse signal and off-pulse signal, it must be possible to logically prevent a malfunction by "the logic filter system excluding B in which erroneous signals are simultaneously input to the RS flip-flop circuit containing the high side". In fact, however, because a difference is present between parasitic capacities of an on-pulse level-shift HVMOS and an off-pulse level-shift HVMOS, a difference also occurs between malfunctions of the HVMOSs. Therefore, a malfunction due to negative noises occurs and it is considered that the malfunction occurrence timing is not when noises are applied but in the course of the recovery (time shorter than switching pulse).

Figure 11:
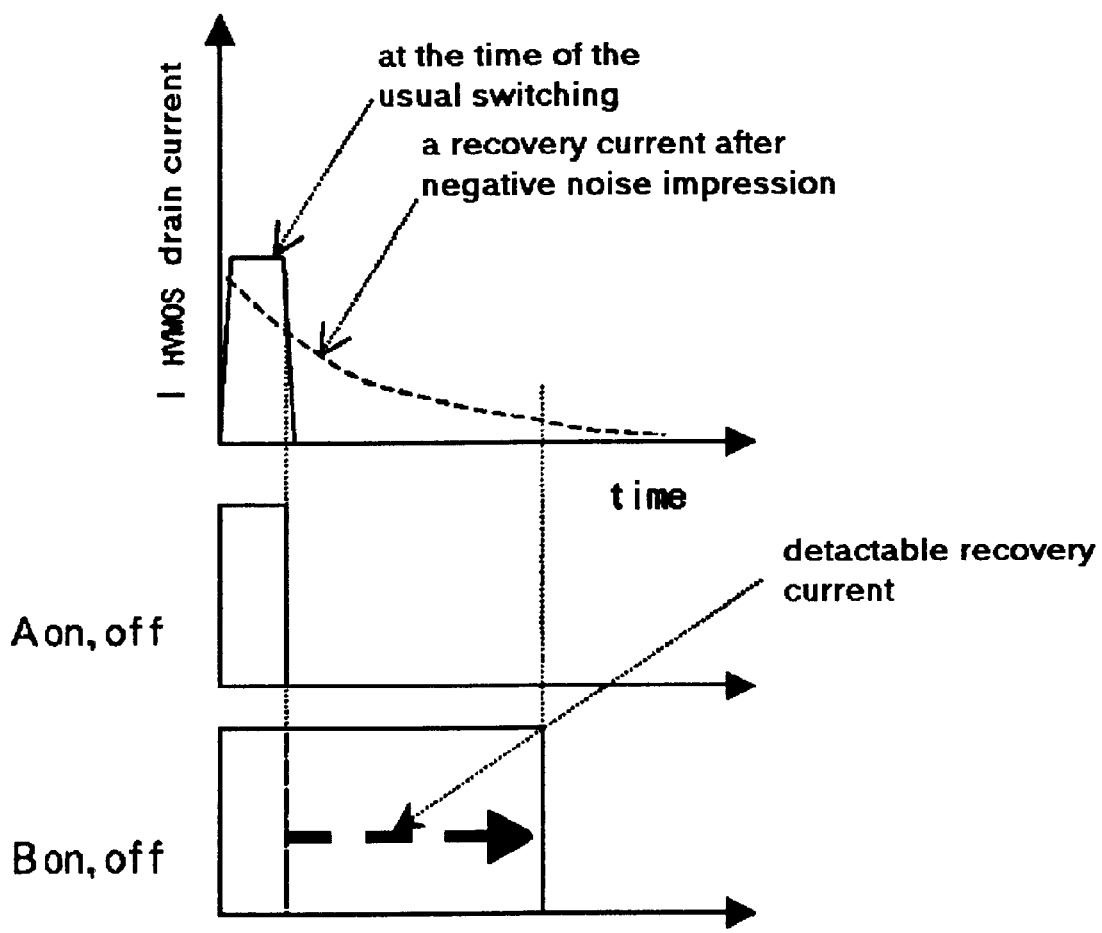
FIG. 11 is an illustration showing signal waveforms of a switching signal and a recovery current.

FIG. 11 shows a recovery current flown after negative noises are applied. From FIG. 11, it is found that the recovery current is different from a normal switching-current waveform. That is, because dv/dt of a level-shift signal is greatly larger than dv/dt of an erroneous signal generated due to a recovery current, by containing a passive circuit having two types of thresholds in level-shift signals of on-pulse and off-pulse, the both signals are distinguished from each other as shown in the lower illustration in FIG. 11. An embodiment for embodying the above mentioned is described below in detail.

Embodiment 1

Figure 1:
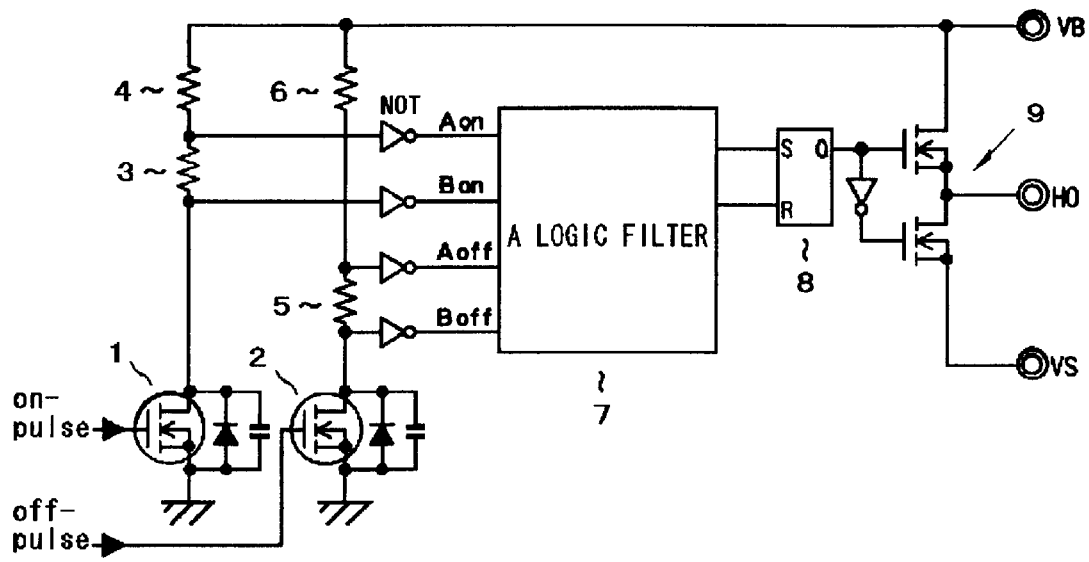
FIG. 1 is a circuit diagram of a semiconductor device showing first embodiment of the present invention.
Figure 12:
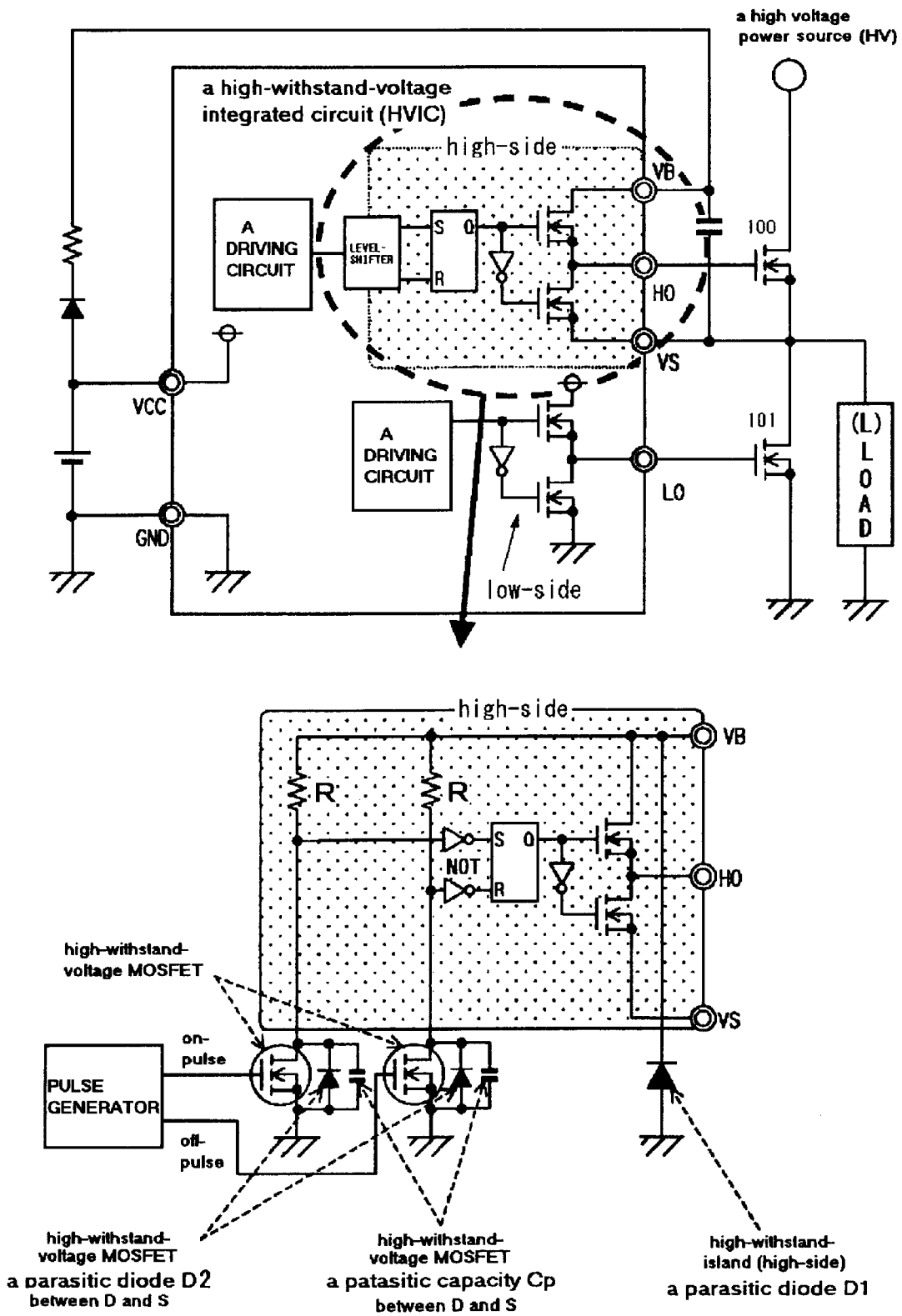
FIG. 12 is a circuit diagram of a conventional semiconductor device.
Figure 13:
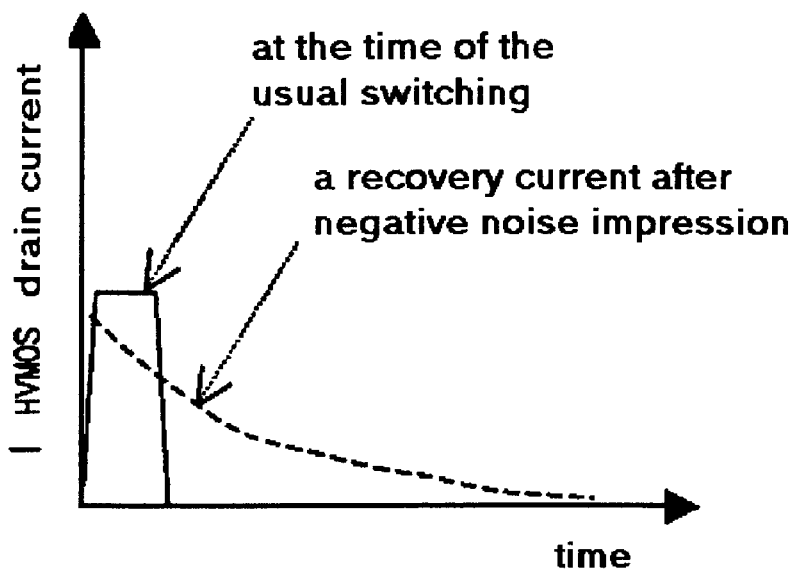
FIG. 13 an illustration showing signal waveforms of a switching signal and a recovery current.
Figure 14:
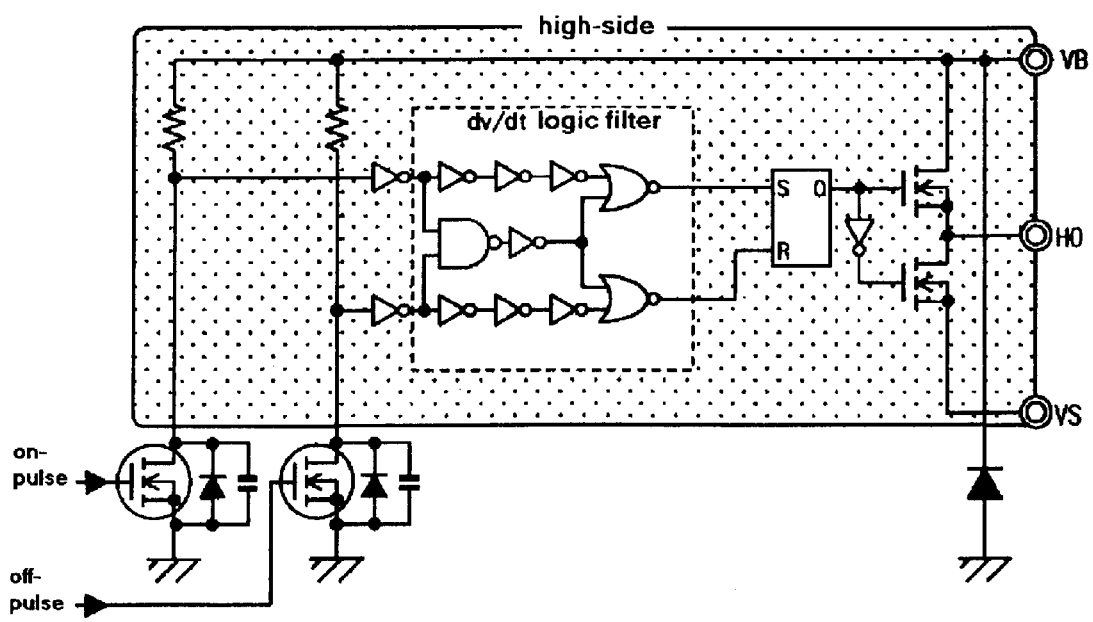
FIG. 14 is a circuit diagram showing details of a logic filter section.

FIG. 1 is a circuit diagram showing an embodiment of the present invention, in which the range from the level-shift section up to the high-side output in an HVIC is shown. An on-pulse and an off-pulse are input to gates of an on-pulse level-shift HVMOS1 and an off-pulse level-shift HVMOS2 from a pulse-generating section (FIG. 12). The drain of the on-pulse level-shift HVMOS1 is connected to the VB through resistors 3 and 4 connected in series and the drain of the off-pulse level-shift HVMOS2 is connected to the VB through resistors 5 and 6 connected in series.

Signals at the both ends of the split-drain-side resistor 3 are supplied to a logic filter 7 through NOT as signals Aon and Bon and signals at the both ends of the split-drain-side resistor 5 are supplied to the logic filter 7 through NOT as signals Aoff and Boff. Thus, a pair of the signals Aon and Aoff and a pair of the signals Bon and Boff having potentials lower than those of the signals Aon and Bon are captured by the logic section 7. An RS flip-flop circuit 8 or the like is connected to the rear stage of the logic filter 7 similarly to the case of the conventional example.

As shown in FIG. 11, when a switching signal is supplied, on-signals of the signals Aon and Bon and Aoff and Boff are almost synchronized with each other. However, when the above recovery current flows, the signals Bon and Boff become longer than signals Aon and Aoff. The logic filter 7 detects the above fact and thereby detects whether the recovery current flows, confirms the presence or absence of the recovery current to the RS flip-flop circuit 8, and outputs a normal signal. The signal is transferred to an HVIC output stage 9 and output from the HVIC as a driving signal.

Embodiment 2

Figure 2:
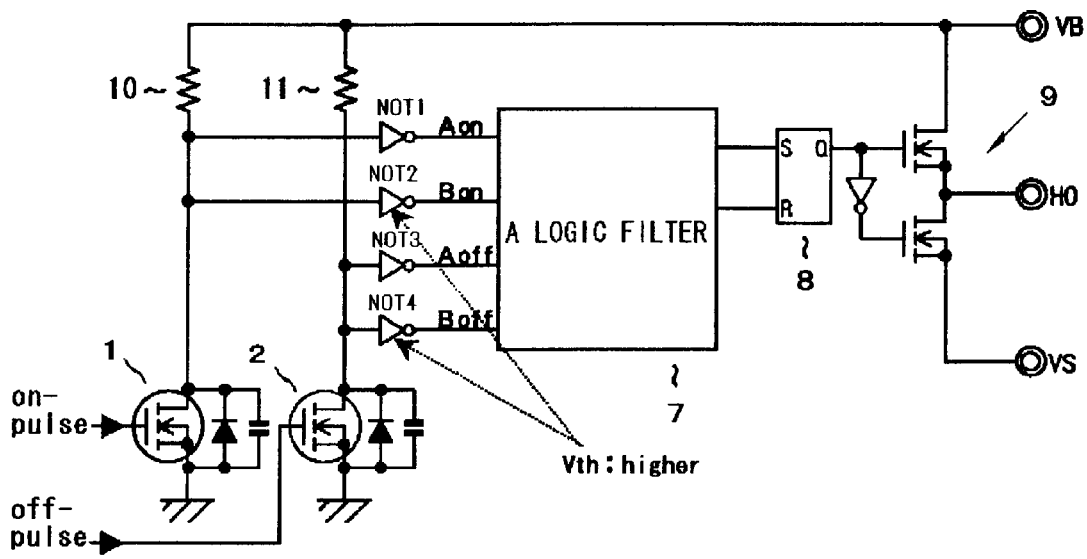
FIG. 2 is a circuit diagram of a semiconductor device showing second embodiment of the present invention.

FIG. 2 is a circuit diagram showing second embodiment of the present invention, which is different from FIG. 1 only in level-shift section. The drain of an on-pulse level-shift HVMOS1 is connected to a VB through a resistor 10 and the drain of an off-pulse level-shift HVMOS2 is connected to the VB through a resistor 11. Moreover, the drain of the on-pulse level-shift HVMOS1 is connected to a logic filter 7 through NOT1 and NOT2 to supply signals Aon and Bon. Moreover, the drain of the off-pulse level-shift HVMOS2 is connected to the logic filter 7 through NOT 3 and NOT 4 to supply signals Aoff and Boff.

In this case, thresholds Vth of NOT2 and NOT4 are higher than those of NOT1 and NOT3. Thus, because the potential of each drain is detected by two thresholds different from each other, it is possible to detect a flown current at two stages, similarly to the case of FIG. 1, confirm whether the flown current is due to a switching pulse or a recovery current, and thereby prevent a malfunction due to a recovery current.

Because the above circuit configuration uses only two level-shift resistors similarly to the case of the conventional example, it is possible to decrease a pattern area and cost.

Embodiment 3

Figure 3:
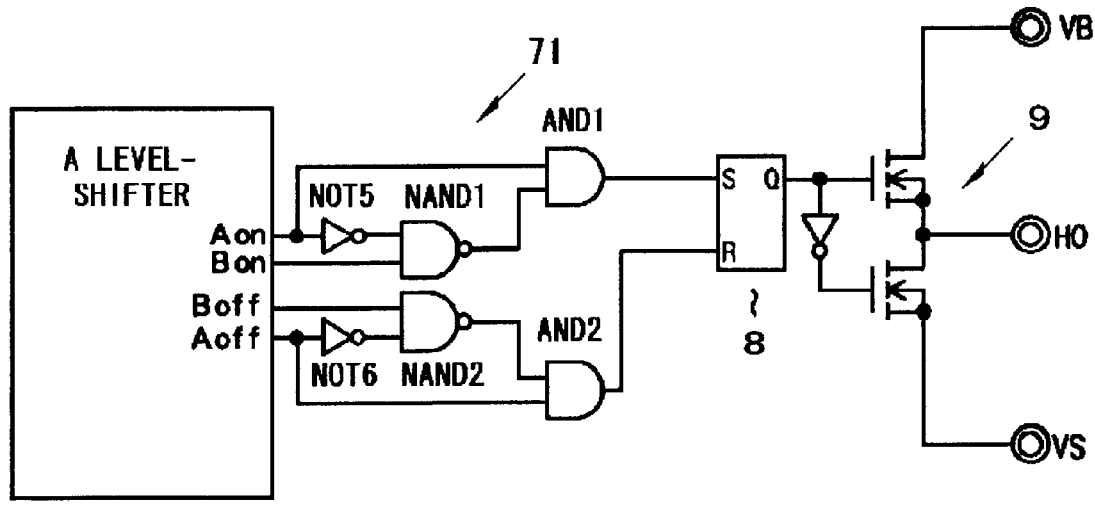
FIG. 3 is an illustration showing a first circuit of the logic filter section in FIGS. 1 and 2.

FIG. 3 shows a first circuit 71 for operating the logic filter 7 in FIGS. 1 and 2. A signal Aon is input to one input section of AND1 and also input to one input section of NAND1 through NOT5 while a signal Bon is input to the other input section. An output of the NAND1 is input to the other input section of the AND1.

Moreover, a signal Aoff is input to one input section of AND 2 and moreover, input to one input section of NAND 2 through NOT 6 and a signal Boff is input to the other input section. An output of the NAND2 is input to the other input section of the AND12. Outputs of the AND1 and AND2 are input to S- and R-terminals of an RS flip-flop circuit 8.

In the case of this circuit configuration, because Aon and Bon and Aoff and Boff are almost synchronized each other under switching, signals Aon and Aoff are input to the RS flip-flop circuit 8 and a high-side output (HO) is switched. However, when a recovery current flows, AND1 outputs "L". Therefore, "L" is always input to S-terminal of the RS flip-flop circuit 8 to keep the last-time state. Therefore, it is possible to prevent a malfunction due to a recovery current flowing for a period longer than a switching-pulse width after negative noises generated by the malfunction are applied.

Embodiment 4

Figure 4:
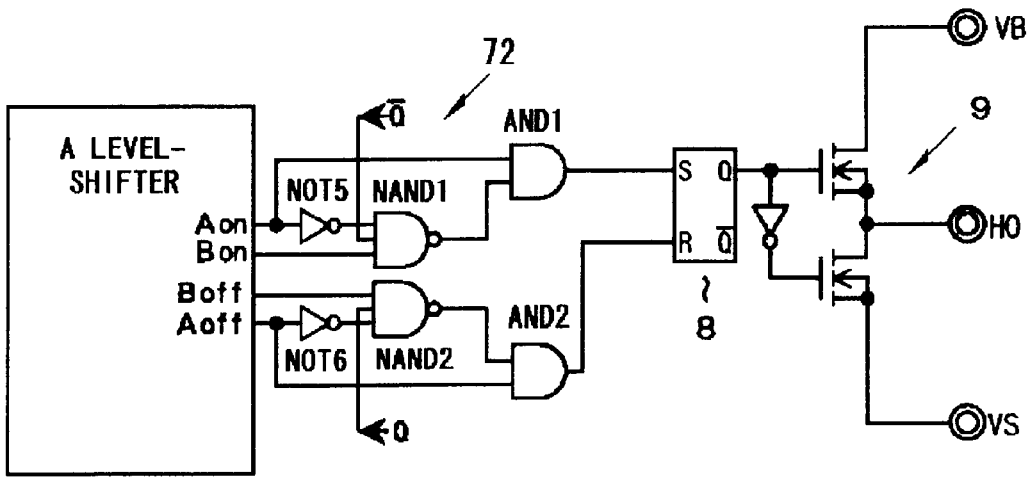
FIG. 4 is an illustration showing a second circuit of the logic filter section in FIGS. 1 and 2.

FIG. 4 shows a second circuit 72 for operating the logic filter 7 in FIGS. 1 and 2. FIG. 4 is different from FIG. 3 in that outputs Q and Q (underline is used instead of over-line in the text) are returned to third input sections of NAND2 and NAND1. Thus, by returning the outputs, it is decided whether to make a recovery-current-detecting signal (NAND output) valid or invalid. This circuit configuration makes it possible to decrease the influence of erroneous detection of a recovery current compared to the case of the embodiment 3.

Embodiment 5

Figure 5:
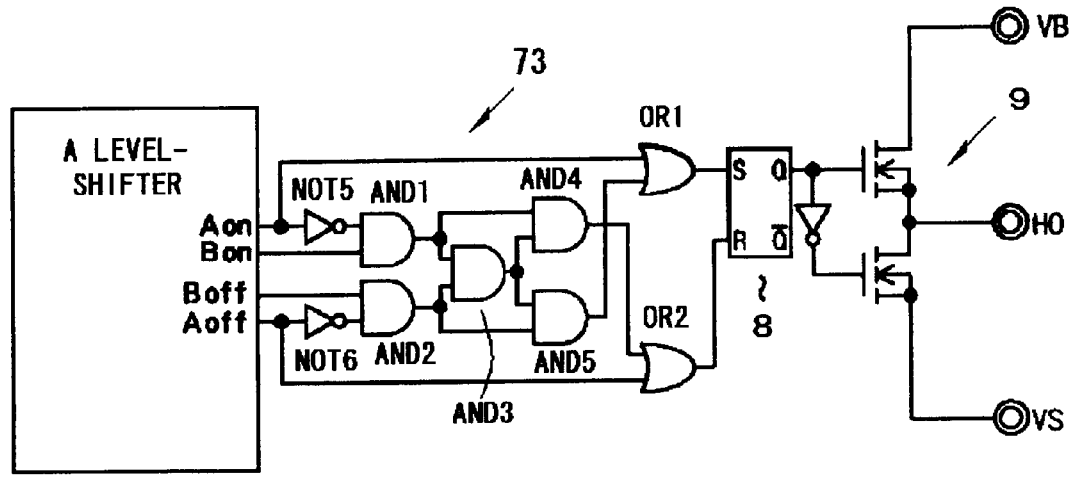
FIG. 5 is an illustration showing a third circuit of the logic filter section in FIGS. 1 and 2.

FIG. 5 shows a third circuit 73 for operating the logic filter 7 in FIGS. 1 and 2. A signal Aon is input to one input section of OR1 and input to one input section of AND1 through NOT5, and a signal Bon is input to the other input section. A signal Aoff is input to one input section of OR2 and input to one input section of AND2 through NOT6, and a signal Boff is input to the other input section.

An output of AND1 is input to one input section of AND3 and input to one input section of AND4, and an output of AND2 is input to the other input section of AND3 and input to one input section of AND5. An output of AND3 is input to the other input sections of AND4 and AND5. Outputs of AND4 and AND5 are input to the other input sections of OR2 and OR1. Outputs of OR1 and OR2 are input to S- and R-terminals of the RS flip-flop circuit 8.

The above embodiments 3 and 4 respectively use a method of masking a detected signal (all on-pulse signal are made invalid when a recovery current is detected at the on-pulse side and the same is true for the case of an off-pulse) when detecting a recovery current. However, this embodiment uses a method of forcibly inputting a signal to a pulse opposite to a pulse detecting a recovery current for a long time because it is estimated that the recovery current is originally generated at the on-side and off-side and the pulse side in which the recovery signal is long causes a malfunction (for example, when a recovery current at the on-pulse side is detected for a long time, it is assumed at this point of time that a signal is input to S-terminal of the RS flip-flop circuit 8 and then an off-pulse is forcibly input to R-terminal of the RS flip-flop circuit 8).

Though said embodiments 3 and 4 respectively prevent a malfunction from occurring, this embodiment immediately recovers the normal state even if a malfunction occurs.

Embodiment 6

Figure 6:
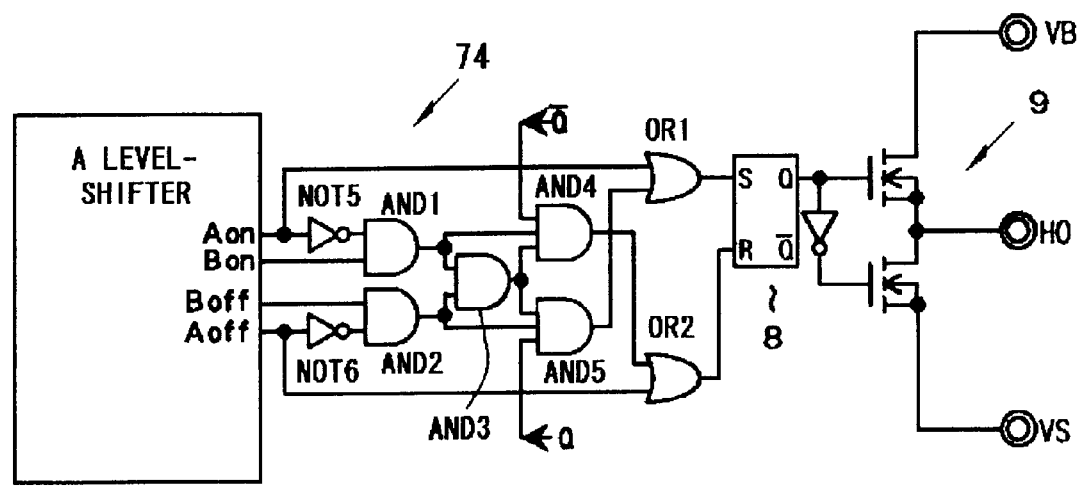
FIG. 6 is an illustration showing a fourth circuit of the logic filter section in FIGS. 1 and 2.

FIG. 6 shows a fourth circuit 74 for operating the logic filter 7 in FIGS. 1 and 2. FIG. 6 is different from FIG. 5 in that outputs Q and Q of an RS flip-flop circuit 8 are returned to the third input section of AND4. By returning the outputs it is decided whether to make a recovery-current-detecting signal (NAND output) valid or invalid. This circuit configuration makes it possible to decrease the influence of erroneous detection of a recovery current compared to the case of the embodiment 3.

Embodiment 7

Figure 7:
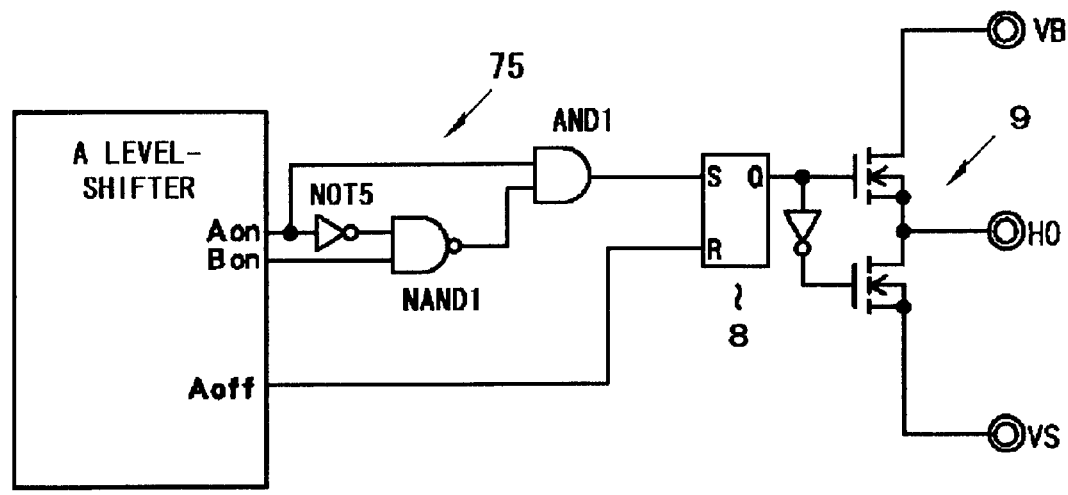
FIG. 7 is an illustration showing a fifth circuit of the logic filter section in FIGS. 1 and 2.

FIG. 7 shows a fifth circuit 75 for operating the logic filter 7 in FIGS. 1 and 2. A signal Aon is input to the input section of AND1 and also input to one input section of NAND1 through NOT5, and a signal Bon is input to the other input section. An output of the NAND1 is input to the other input section of the AND1. Moreover, an output of the AND1 is input to S-terminal of an RS flip-flop circuit 8 and a signal Aoff is input to R-terminal.

As found by comparing this embodiment with the embodiment 3 (FIG. 3), a malfunction-preventing circuit according to detection of an off-pulse-side recovery current is omitted. This is because there is also an application allowing that only a short circuit does not occur as the minimum operation condition of a one-phase half-bride driver. Therefore, circuits unnecessary for the above case are omitted to the utmost. Thereby, in the case of this embodiment, it is possible to decrease the number of components and the cost compared to the case of the embodiment 3.

Embodiment 8

Figure 8:
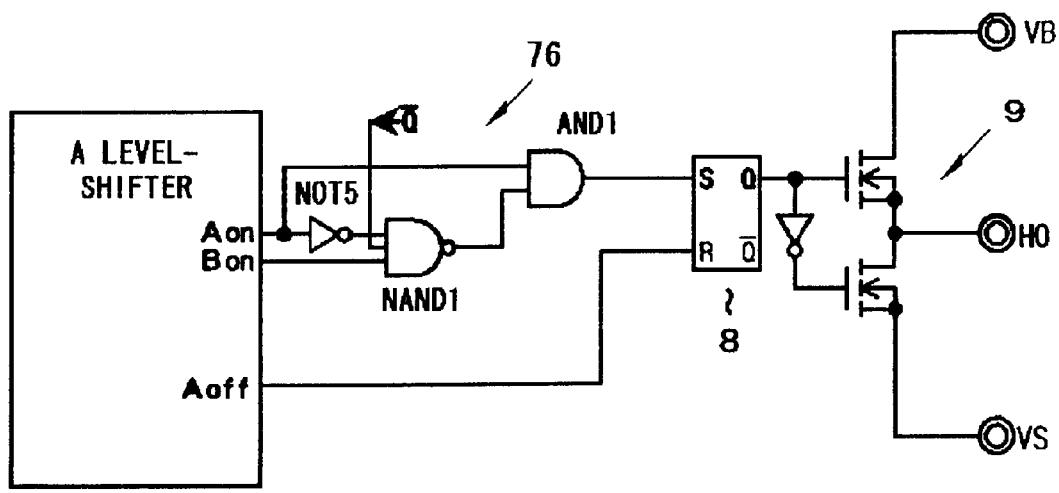
FIG. 8 is an illustration showing a sixth circuit of the logic filter section in FIGS. 1 and 2.

FIG. 8 shows a sixth circuit 76 for operating the logic filter 7 in FIGS. 1 and 2. This embodiment omits the malfunction-preventing circuit of the embodiment 4 (FIG. 4) according to detection of an off-side recovery current. This is because there is also an application allowing that only a short circuit does not occur as the minimum condition of a one-phase bridge driver. Therefore, circuits unnecessary for the above case are omitted to the utmost. Thereby, it is possible to decrease the number of components and cost compared to the case of the embodiment 4.

Embodiment 9

Figure 9:
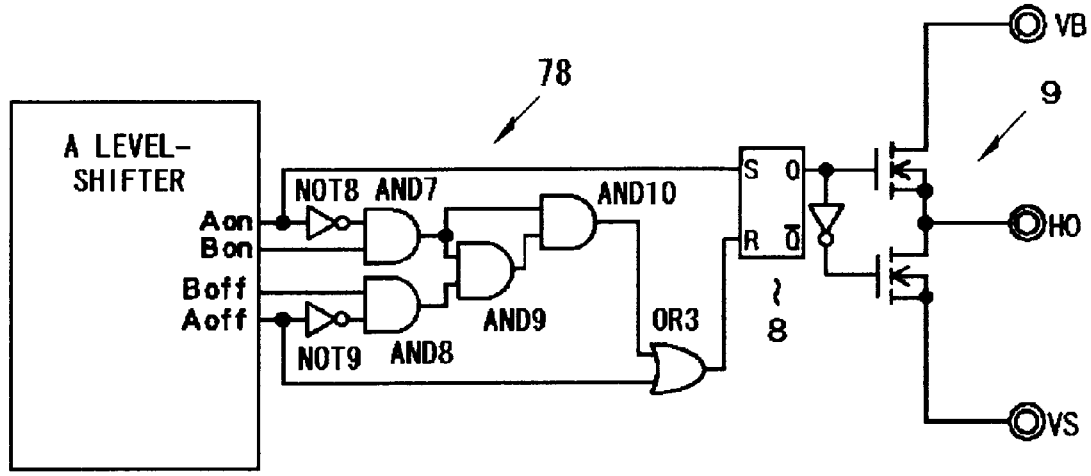
FIG. 9 is an illustration showing a seventh circuit of the logic filter section in FIGS. 1 and 2.

FIG. 9 shows a seventh circuit 78 for operating the logic filter 7 in FIGS. 1 and 2. A signal Aon is input to S-terminal of an RS flip-flop circuit 8 and also input to one input section of AND7 through NOT8, and a signal Bon is input to the other input section. A signal Aoff is input to one input section of OR3 and also input to one input section of the AND8 through NOT9, and a signal Boff is input to the other input section.

An output of the AND7 is input to one input section of AND9 and also input to one input section of AND10, and an output of the AND8 is input to the other input section of the AND9. An output of the AND9 is input to the other input section of the AND10 and an output of the AND10 is input to the other input section of the OR3. An output of the OR3 is input to R-terminal of an RS flip-flop circuit 8.

As found by comparing this embodiment with the embodiment 5 (FIG. 5), a section is omitted which forcibly inputs an on-pulse to S-terminal of the RS flip-flop circuit 8 when a recovery current is detected. This is because there is an application allowing that only a short circuit does not occur as the minimum condition of a one-phase half-bridge driver. Therefore, circuits unnecessary for the above case are omitted to the utmost. Thereby, it is possible to decrease the number of components and cost compared to the case of the embodiment 5.

Embodiment 10

Figure 10:
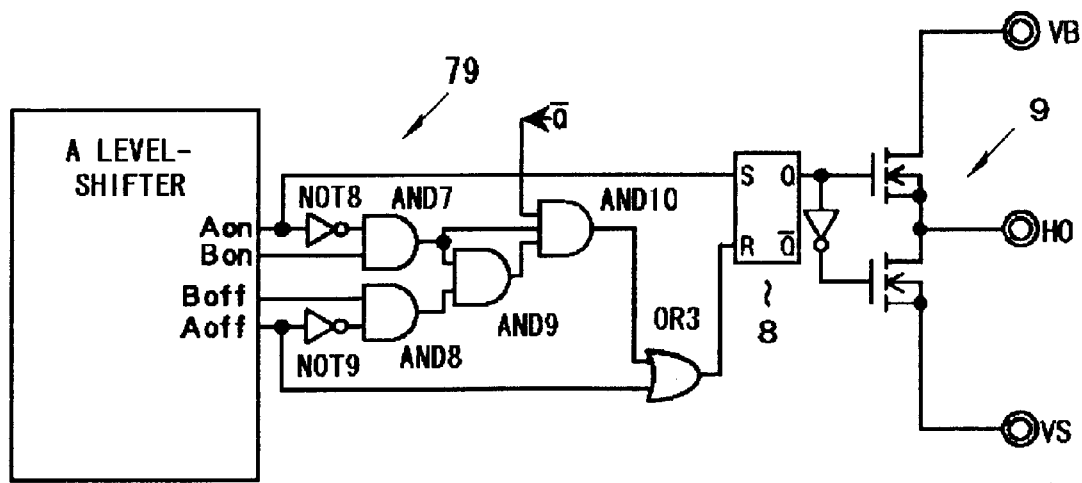
FIG. 10 is an illustration showing an eighth circuit of the logic filter section in FIGS. 1 and 2.

FIG. 10 shows an eighth circuit 79 for operating the logic filter 7 in FIGS. 1 and 2. In the case of this embodiment, a section is omitted which forcibly inputs an on-pulse to S-terminal of an RS flip-flop circuit 8 when the recovery current of the embodiment 6 (FIG. 6) is detected. This is because there is an application allowing that only a short circuit does not occur as the minimum operational condition of a one-phase half-bridge driver. Therefore circuits unnecessary for the above case are omitted to the utmost. Thereby, it is possible to decrease the number of components and cost compared to the case of the embodiment 6.

According to claim 1 of the present invention, it is possible to avoid a malfunction due to a recovery signal because a level-shift circuit is provided with means for outputting no abnormal signal by splitting a switching-on level-shift resistor and a switching-off level-shift resistor into two resistors respectively, fetching potentials at the both ends of each of one-side resistors as signals Aon and Bon and signals Aoff and Boff, and determining that a recovery signal is detected when output periods of the signals Bon and Boff are longer than those of the signals Aon and Aoff.

According to claim 2 of the present invention, it is possible to avoid a malfunction due to a recovery current because a level-shift circuit of the high-side section of an HVIC is provided with means for outputting no abnormal signal by fetching potentials from one end of a switching-on level-shift resistor (10) as signals Aon and Bon through voltage-detectors (1) and (2) and detect potentials from one end of a switching-off level-shift resistor (11) as signals Aoff and Boff through voltage-detectors (3) and (4) having thresholds higher than those of the voltage-detectors (1) and (2), and determining that a recovery signal is detected when output periods of the signals Bon and Boff are longer than those of the signals Aon and Aoff.

What is claimed is:

1. A semiconductor device for driving a power semiconductor comprising:
    a level-shift circuit having a resistance member and a switching device;
    said resistance member comprising a switching-on level-shift resistor which is divided into two first resistors; and a switching-off level-shift resistor which is divided into two second resistors;
    a votage detector which detects potentials of the resistance member as signals;
    a logic filter set which logically excludes an error signal due to dv/dt from the signals detected by the votage detector; and
    a drive part which drives the power semiconductor based on the output of said logic filter set;
    wherein said voltage detector detects potentials of both ends of one of the first resistors as signals Aon and Bon, and detects potentials of both ends of one of the second resistors as signals Aoff and Boff,
    wherein when an output period of the signals Bon and Boff is longer than that of the signals Aon and Aoff, the logic filter set does not output an abnormal signal.

2. A semiconductor device for driving a power semiconductor comprising:
    a level-shift circuit having a resistors and a switching device;
    said resistors comprising a switching-on level-shift resistor; and a switching-off level-shift resistor;
    a votage detector which detects potentials of the resistors as signals;
    a logic filter set which logically excludes an error signal due to dv/dt from the signals detected by the voltage detector; and
    a drive part which drives the power semiconductor based on the output of said logic filter set;
    wherein said votage detectors detects potentials of the ends of the switching-on resistor as signals Aon and Bon, and said votage detector detects potentials of the ends of the switching-off resistor as signals Aoff and Boff,
    wherein voltage detector having a threshold higher than those of the voltage detector and,
    wherein when an output period of the signals Bon and Boff is longer than that of the signals Aon and Aoff, the logic filter set does not output an abnormal signal.

3. The semiconductor device according to claim 1, wherein when a recovery signal is detected in accordance with an on- or off-pulse, either pulse signal detecting the recovery signal is masked so as not to be output.

4. The semiconductor device according to claim 1, wherein when a recovery signal is detected in accordance with an on- or off-pulse, an output of the semiconductor device is fed back and either pulse signal detecting the recovery signal is masked so as not to be output.

5. The semiconductor device according to claim 1, wherein when a recovery signal is detected in accordance with an on- or off-pulse for a long time, the semiconductor device immediately recovers from a malfunction by outputting the other signal.

6. The semiconductor device according to claim 1, wherein only an on-side recovery signal is detected and in this case, only on-side signal is masked so as not to be output.

7. The semiconductor device according to claim 1, wherein only an on- or off-side recovery signal is detected and the off-side recovery signal is output only when the on-side recovery signal is detected for a long time.

8. The semiconductor device according to claim 2, wherein when a recovery signal is detected in accordance with an on- or off-pulse, either pulse signal detecting the recovery signal is masked so as not to be output.

9. The semiconductor device according to claim 2, wherein when a recovery signal is detected in accordance with an on- or off-pulse, an output of the semiconductor device is fed back and either pulse signal detecting the recovery signal is masked so as not to be output.

10. The semiconductor device according to claim 2, wherein when a recovery signal is detected in accordance with an on- or off-pulse for a long time, the semiconductor device immediately recovers from a malfunction by outputting the other signal.

11. The semiconductor device according to claim 2, wherein only an on-side recovery signal is detected and in this case, only on-side signal is masked so as not to be output.

12. The semiconductor device according to claim 2, wherein only an on- or off-side recovery signal is detected and the off-side recovery signal is output only when the on-side recovery signal is detected for a long time.

* * * * *